United States Patent

[11] 3,555,294

[72] Inventor Ronald L. Treadway
Scottsdale, Ariz.
[21] Appl. No. 619,379
[22] Filed Feb. 28, 1967
[45] Patented Jan. 12, 1971
[73] Assignee Motorola, Inc.
Franklin Park, Ill.
a corporation of Illinois

[54] TRANSISTOR-TRANSISTOR LOGIC CIRCUITS HAVING IMPROVED VOLTAGE TRANSFER CHARACTERISTIC
7 Claims, 8 Drawing Figs.

[52] U.S. Cl. .......... 307/203, 307/218, 307/215, 307/317
[51] Int. Cl. .......... H03k 19/08, H03k 19/36
[50] Field of Search .......... 307/213, 214, 215, 300, 303, 203, 270

[56] References Cited
UNITED STATES PATENTS

| | | | |
|---|---|---|---|
| 3,119,025 | 1/1964 | Lourie et al. | 307/270 |
| 3,243,606 | 3/1966 | Green et al. | 307/270 |
| 3,311,900 | 3/1967 | Gaunt | 307/270 |
| 3,436,563 | 4/1969 | Regitz | 307/270 |
| 3,192,399 | 6/1965 | IH | 307/300X |
| 3,229,119 | 1/1966 | Bohn et al. | 307/215X |
| 3,265,906 | 8/1966 | Feller | 307/214 |

OTHER REFERENCES
Electronics (Mag), 3-65, (pg. 21)

*Primary Examiner*—Donald D. Forrer
*Assistant Examiner*—Harold A. Dixson
*Attorney*—Mueller & Aichele

ABSTRACT: Transistor-transistor logic (TTL) circuitry having a bypass network connected to the output device of the circuitry for providing turnoff drive for the output device. The bypass network includes a resistor connected in series with at least one PN junction, and such PN junction is within either a simple diode or a transistor. The bypass network prevents undesirable spiking in the output signal of the TTL logic circuitry.

INVENTOR.
Ronald L. Treadway

BY
Mueller, Aichele & Rauner
ATTY'S.

TRANSISTOR-TRANSISTOR LOGIC CIRCUITS HAVING IMPROVED VOLTAGE TRANSFER CHARACTERISTIC

This invention relates generally to high speed logic circuitry and more particularly to high speed transistor-transistor logic (TTL or T$^2$L) circuits having an improved discharge or pull down circuit for the T$^2$L circuit output device which is switched into and out of conduction. The terms "bypass," "-pulldown" and "discharge" will be used interchangeably hereinafter with reference to the network through which turnoff drive current flows when the output device turns off.

BACKGROUND OF THE INVENTION

Known prior art T$^2$L or TTL logic circuits include one or more interstage current drive transistors directly cascaded between an output semiconductor device, such as a transistor, and a source of binary input logic signals. The output device is typically either in saturation or is turned off, depending upon the binary logic signal condition at the input of the T$^2$L circuit. When binary logic signals above a predetermined level are concurrently applied to multiple input electrodes of an input transistor of the T$^2$L circuit, the output transistor receives a turn on drive current and is driven into saturation.

The output terminal of the T$^2$L circuit is commonly connected to the collector of an output transistor, and for switching operation the potential on this collector is at one of two distinct levels of logic. When the output transistor is conducting in saturation, the collector thereof is at a potential equal to the collector-to-emitter saturation voltage of the output transistor, $V_{CE(SAT)}$, and using positive logic the circuit output terminal will be at a binary ZERO level. When the output transistor is turned off and the collector voltage of the output transistor increases, the level at the output terminal will rise from a binary ZERO level to a binary ONE level when the output transistor is completely turned off.

The time required for the output transistor to turn off and hence the overall switching speed of the logic circuit depends in large measure on the time required for the base charge to be removed or "pulled out " of the base of the output transistor. In the past, the discharging of the base region of the output transistor was accomplished using a so-called "pulldown" resistor which was commonly connected between the base region of the output transistor and some point of reference potential. Thus, when it was desired to turn off the output transistor, the conductive path through the pulldown resistor provided good turnoff drive necessary to remove the base charge from the output transistor and terminate conduction therein.

While it is desirable to have a good turnoff drive for the output transistor in order to maintain a desired switching speed for the T$^2$L circuit, there is a major disadvantage in using only a pulldown resistor connected between the base region of the output transistor and a point of reference potential for discharging the output transistor. This disadvantage may be attributed to the fact that current will begin to flow in the pulldown resistor prior to the time that the input signals applied to the T$^2$L circuit reach a level sufficiently high to drive the output transistor into saturation and switch the circuit output terminal from one to the other of its two levels of digital logic. This current flow in the pulldown resistor produces a corresponding unwanted reduction in the DC output voltage level at the circuit output terminal in the absence of a proper binary signal condition at the input of the circuit. Thus, when extraneous noise signals are coupled to the prior art T$^2$L circuit having only a pulldown resistor to discharge the output device, corresponding unwanted fluctuations in the output voltage level will be produced when current flows in the pulldown resistor.

SUMMARY OF THE INVENTION

An object of this invention is to provide a transistor-transistor logic (T$^2$L) circuit having an improved input voltage versus output voltage transfer characteristic.

Another object of this invention is to provide a new and improved T$^2$L logic circuit having a high degree of noise immunity.

Another object of this invention is to provide a T$^2$L logic circuit which may be constructed using all NPN transistors in a monolithic integrated circuit including an improved discharge or pulldown circuit for the output device which ensures good turnoff drive for the output device.

The present invention features a T$^2$L logic circuit having a new and novel bypass network connected between the output device of the circuit and a point of reference potential. This bypass network provides good turnoff drive for the output device and prevents spiking in the output signals for input voltages which are not sufficiently high to drive the output device into saturation.

Another feature of this invention is the provision of a T$^2$L digital logic circuit wherein the bypass pulldown network for the output device includes either a combination of a resistor and a diode or a combination of resistors and a transistor serially connected between the output device and a point of reference potential. The diode portion of the bypass network can be constructed using either a simple PN diode or a diode formed by connecting two electrodes of a transistor together, and the PN junction in the bypass network ensures that discharge current will not flow therein until it is desired to turn on the output device.

Briefly described, the TTL logic circuitry according to this invention includes an input transistor for receiving one or more binary input logic signals, an output transistor which is switched into and out of saturation, and an inverting or current drive transistor connected between the input and output transistors for providing turn on drive current for the output transistor when binary logic signals above a predetermined logical level are concurrently applied to the input transistor. An improved bypass pulldown network is connected between the output transistor and a point of reference potential and includes at least on PN junction connected to the output transistor and in series with a resistor for providing a discharge path and turnoff drive for the output transistor when the latter turns off. Current will not flow in the above-described bypass network until the output transistor turns on and off, ensuring that input signals below a certain logical level do not produce corresponding spiking in the output voltage of the TTL logic circuitry.

DESCRIPTION OF PREFERRED EMBODIMENTS

Figure 2:
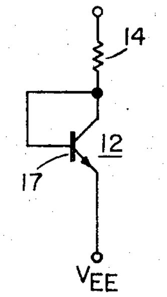
Figure 3:
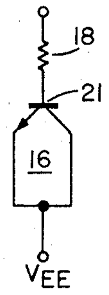
Figure 4:
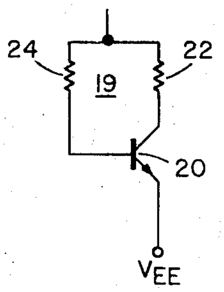

Referring to the drawing in more detail, there are shown in FIGS. 1 through 4 four types of bypass networks which may be used in any of the logic circuits in FIGS. 5 through 7 in order to impart to these logic circuits an improved voltage transfer characteristic which will be described in more detail below with reference to FIG. 8. The transistor bypass network 19 in FIG. 4 is used each of the logic circuits shown in FIGS. 5 through 7, but the diode bypass networks in FIGS. 1 through 3 can be substituted for the transistor bypass network 19 in FIG. 4 in accordance with the novel teachings of this invention.

Figure 1:
FIGS. 1 through 4 illustrate four different types of bypass networks which are used in the novel T$^2$L circuits according to this invention.
Figure 5:
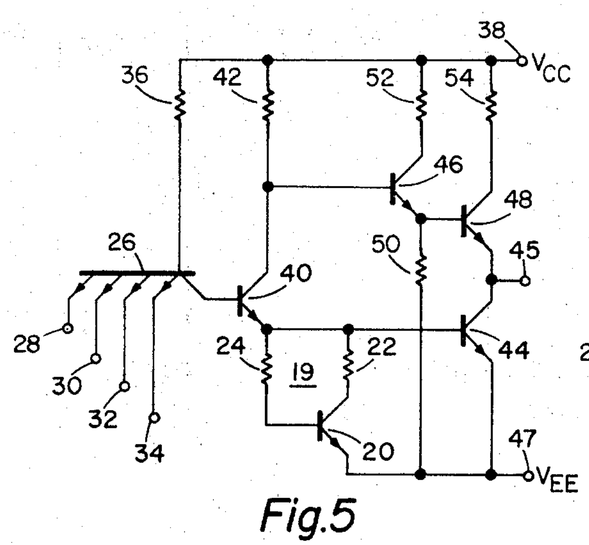
FIG. 5 is a T$^2$L NAND logic gate according to this invention.
Figure 6:
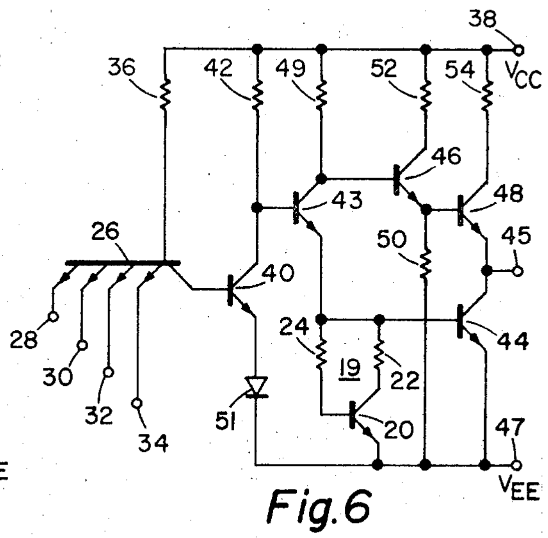
FIG. 6 is a T$^2$L AND logic gate according to this invention.
Figure 7:
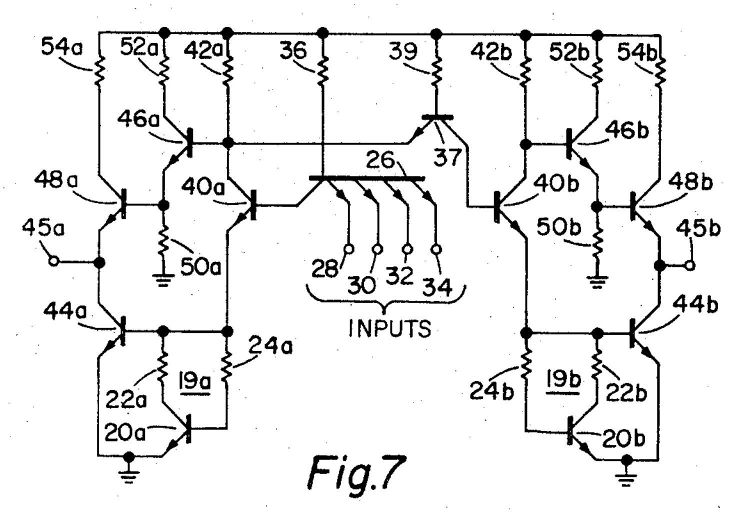
FIG. 7 is a combination AND/NAND T$^2$L logic circuit according to this invention which combines the features of the circuits shown in FIGS. 5 and 6 to perform the dual AND/NAND logic function.

The diode bypass network in FIG. 1 consists of resistor 10 and diode 11 which are adapted to be connected between the base region of the output device 44 in FIGS. 5 through 7 and a point of reference potential $V_{EE}$. The diode bypass network in FIG. 2 is also adapted to be connected between the base region of the output device 44 and a point of reference potential $V_{EE}$, and the bypass network in FIG. 2 differs from that shown in FIG. 1 in that the diode action is provided by a transistor diode 12, the collector and base electrodes of which are connected together. The diode bypass network 16 shown in FIG. 3 which may be used to replace the bypass networks in FIGS. 1 and 2 also includes a transistor diode 21 which is connected in series with a resistor 18. The emitter and collector electrodes of transistor diode 21 are connected together at a point of reference potential $V_{EE}$.

The transistor bypass network 19 shown in FIG. 4 will be described hereinafter with reference to the logic circuits in FIGS. 5 through 7 and with reference to the voltage transfer characteristic 13 shown in FIG. 8. However, it will be appreciated by those skilled in the art that the diode bypass networks in FIGS. 1 to 3 may be substituted for the transistor bypass network 19 in FIG. 4 without departing from the scope of this invention.

The $T^2L$ logic circuit in FIG. 5 includes a multiple emitter input transistor 26 having input terminals 28, 30, 32 and 34 which are connectable to sources of binary logic signals. A current drive transistor 40 has its base region connected directly to the collector region of the input transistor 26, and the transistor 40 is referred to as a current drive transistor since it furnishes the base drive for the output transistor 44 to which it is connected. The logic circuit of FIG. 5 also includes a second output transistor 48 connected in push-pull with the one output transistor 44, and a second current drive transistor 46 is connected between the collector of transistor 40 and the base of the second output transistor 48. Transistor 46 provides base drive to the output transistor 48 when the collector of transistor 40 swings from a low to a high potential.

Collector load resistors 42, 52 and 54 are connected to the collectors of transistors 40, 50 and 48 respectively to establish the desired current levels for proper circuit operation, and sources of collector and emitter potential $V_{CC}$ and $V_{EE}$ are connected respectively to the voltage supply terminals 38 and 47. As previously mentioned, the transistor bypass network 19 is connected directly between the base of output transistor 44 and a point 47 of reference potential $V_{EE}$ which, in this case, is ground potential. The individual circuit components of the logic circuits in FIGS. 5, 6 and 7 will not be described further except with respect to circuit operation, and the reference numerals used in FIG. 5 are also used in FIGS. 6 and 7 to denote corresponding circuit components which produce identical functions within the three digital logic circuits shown.

OPERATION

In order to fully appreciate and understand the novel features of the bypass networks in FIGS. 1 to 4 and particularly the transistor bypass network 19 in each of the circuits in FIG. 5 through 7, assume initially that network 19 in FIG. 5 is replaced by a single pulldown resistor (not shown) connected between the base of the output transistor 44 and ground potential $V_{EE}$. Using positive logic, in the absence of an "all ONE" binary input signal condition at terminals 28, 30, 32 and 34 the output transistor 44 is turned off and the output transistor 48 is conducting current through output terminal 45 to an external load (not shown). Assume now that the binary signals applied to the terminals 28, 30, 32 and 34 of the input transistor 26 all swing sufficiently high to partially reverse bias the multiple emitter-base junctions of the input transistor 26 and force current across the base-collector junction of transistor 26 and into the base of current drive transistor 40. Current will flow through the above-described pulldown resistor and this current is approximately equal to the base-emitter voltage $V_{BE}$ of transistor 40 minus the offset voltage $V_{OFFSET}$ of transistor 26 plus the input voltage $E_{IN}$ divided by the value of the pulldown resistor. The voltage drop across the pulldown resistor prior to the time that the output transistor 44 turns on or off is reflected through the serially connected emitter-base regions of transistors 46 and 48 and seen at the output terminal 45.

Figure 8:
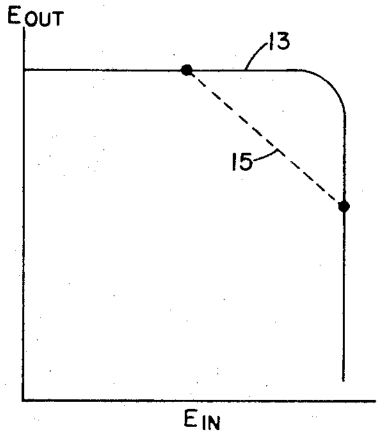
FIG. 8 is a transfer characteristic of input voltage versus output voltage for the circuits shown in FIGS. 5 through 7, and the dotted line portion of the transfer characteristic in FIG. 8 represents a portion of the voltage transfer characteristic of the above-described prior art T$^2$L logic circuits.

The decrease in output voltage $E_{OUT}$ at output terminal 45 with an increasing input voltage $E_{IN}$ is illustrated in FIG. 8, and the dotted portion 15 of the circuit voltage transfer characteristic $E_{IN}$ vs $E_o$ is produced by current flowing in the single pulldown resistor of the prior art. As will be seen from the following description, the portion 15 of the voltage transfer characteristic is replaced by portion 13 in FIG. 8 in accordance with the teachings of this invention.

Consider now the $T^2L$ logic circuit according to the present invention wherein the single pulldown resistor of the prior art logic circuit has been replaced by one of the bypass networks shown in FIGS. 1 to 4. The diode bypass or pulldown network of FIG. 1 includes a resistor 10 connected in series with diode 11, and this series diode bypass network can be used to replace the transistor bypass network 19 which is used in the logic circuits in FIGS. 5 to 7. The transistor bypass network 19 of FIG. 4 is preferred over those shown in FIGS. 1 to 3, but any of the bypass networks in FIGS. 1 to 3 may be used to replace the network 19 and obtain satisfactory circuit operation. Since the offset voltage of the diode 11 is in the order of .6 or 7 volt, approximately the same as the base-emitter offset voltage $V_{BE}$ of the output transistor 44, the diode bypass network appears as an infinite impedance during voltage buildup at the base of the output transistor 44. When the base voltage at the output transistor 44 exceeds the $V_{BE}$ of the transistor, emitter current will flow in the transistor 44 as it is biased into saturation. At this time current will flow into the bypass network, and the value of the pulldown current is approximately equal to that drawn by the previous straight pulldown resistor. When a binary input signal at any one of the input terminals 28, 30, 32 or 34 of the input transistor 26 falls to a binary ZERO level, the base drive is removed from transistor 40 and the output transistor 44 begins to turn off. The diode bypass network in FIG. 1 will provide the turnoff drive for the output transistor 44, and discharge current will flow from the base of output transistor 44 through resistor 10 and diode 11 to ground.

The diode bypass networks 12 and 16 in FIGS. 2 and 3 are alternative connections which may be used in the logic circuits shown in FIGS. 5 through 7, and these bypass networks use the transistors 17 and 21 with two electrodes thereof tied together to provide the diode action as in a normal PN diode.

When the current drive transistor 40 begins to turn off, the voltage at the base of a second current drive transistor 46 rises and turns on transistors 46 and 48 when it reaches a value sufficient to overcome the 2 $V_{BE}$ offset voltage of the transistors 46 and 48. Thus, transistor 48 drives an output load (not shown) connected to the output terminal 45 when any one of the inputs to the input terminals 28, 30, 32 and 34 swings to a binary ZERO logical level. When all inputs which are applied to input transistor 26 again go high, transistors 46 and 48 are turned off and transistor 44 is again driven into saturation, receiving its collector current from an external load connected to the output terminal 45.

The logic circuit shown in FIG. 6 differs from that shown in FIG. 5 in that a reinverting transistors 43, a collector load resistor 49 and a diode 51 have been added to the circuit components in FIG. 5. The addition of these three components to the circuit shown in FIG. 5 ensures that the noninverting AND logic function is provided by the logic circuit in FIG. 6. When transistor 40 in FIG. 6 is driven into conduction, the voltage at the base of the reinverting transistor 43 is insufficient to turn the latter transistor on, and the voltage at the base of current drive transistor 46 is sufficiently high to bias transistors 46 and 48 conducting. The output transistor 44 is turned off and the logical level at the output terminal 45 is high or at a binary ONE level. When one of the binary inputs to the input transistor 26 swings low, transistor 40 turns off and transistor 43 is turned on to apply base drive to the output transistor 44 as did the current drive transistor 40 in FIG. 5.

With regard to the logic circuit shown in FIG. 6 consider a prior art noninverting AND logic circuit similar to FIG. 6 but having only a single pulldown resistor connected to the base of the output transistor 44 instead of the diode bypass network 19. With transistor 40 conducting, the voltage at the emitter of transistor 43 would be equal to the $V_{BE}$ of diode 51 plus the saturation voltage $V_{CE(SAT)}$ of the transistor 40 minus the $V_{BE}$ of the transistor 43. The resultant voltage $V_{CE(SAT)}$ across the prior art pulldown resistor draws a small emitter current from transistor 43. With the transistor 43 conducting slightly and its current gain approximately equal to one, the collector current of transistor 43 will be substantially equal to the emitter current thereof if the collector resistor 49 is approximately equal in value to the pulldown resistor. Therefore, with transistor 43 conducting slightly, the base voltage at the current drive transistor 46 will be $V_{CC}-V_{CE(SAT)}$, establishing the DC output level at terminal 45 at a value equal to $V_{CE(SAT)}$ lower than it is when the bypass network of this invention is used. By using the bypass network 19 in FIG. 6 instead of a single pulldown resistor, the voltage level $V_{CE(SAT)}$ at the base of transistor 44 when transistor 44 is turned off is insufficient to bias the pulldown transistor 20 into conduction. Thus, no current flows from the transistor 43 in FIG. 6 when all inputs to the terminals 28, 30, 32 and 34 are high or at a logical ONE level.

The dual AND/NAND circuit of FIG. 7 combines the novel features described above with reference to FIGS. 5 and 6 and includes a pair of diode bypass networks **19*a* and 19*b* which function identically to the bypass networks 19 shown in FIGS. 5 and 6. Identical reference characters in FIGS. 5 through 7** have been used to denote corresponding circuit components, and the subscripts *a* and *b* have been used to differentiate the corresponding components of the two bypass networks shown in FIG. 7. Accordingly, each circuit component in FIG. 7 will not be separately identified since such separate identification is not necessary to understand the operation of this circuit. It will be apparent to those skilled in the art that the left-hand portion of the logic circuit in FIG. 7 in which the subscript *a* is used performs the inverting NAND function and the right-hand portion of the logic circuit shown in FIG. 7 in which the subscript *b* is used performs the noninverting AND function.

When all of the inputs to transistor 26 are high, the emitter of transistor 37 is low and the current drive transistor **40*b* is turned off. With transistor 40*b* turned off the output terminal 45*b* is high at a logical ONE level. When any one of the inputs to the input transistor 26 goes low, the emitter of transistor 37 swings high and base drive is applied to transistor 40*b* from the collector of transistor 37, turning on the output transistor 44*b*, and pulling the output terminal 45*b* to a binary ZERO level ($V_{CE(SAT)}$ of the output transistor 44*b***).

The left-hand portion of the dual gate in FIG. 7 performs the NAND function in a manner identical to that of the NAND gate in FIG. 5 in response to changes in binary levels at the input terminals 28, 30, 32 and 34.

The following table is given by way of illustration and includes component values for the three circuits in FIGS. 5 to 7 which have been constructed in accordance with the principles of this invention and which have been successfully operated.

TABLE

| Resistor: | | Value |
|---|---|---|
| R22 | ohms | 500 |
| R22a | do | 500 |
| 22b | do | 500 |

TABLE—Continued

| Resistor: | | Value |
|---|---|---|
| 24 | do | 250 |
| 24a | do | 250 |
| 24b | do | 250 |
| 36 | do | 2, 400 |
| 39 | do | 2, 400 |
| 42 | do | 800 |
| 42a | do | 800 |
| 42b | do | 800 |
| 50 | do | 3, 500 |
| 50a | do | 3, 500 |
| 50b | do | 3, 500 |
| 52 | do | 180 |
| 52a | do | 180 |
| 52b | do | 180 |
| 54 | do | 90 |
| 54a | do | 90 |
| 54b | do | 90 |
| Voltage supplies: | | |
| $V_{EE}$ | volts | 0 |
| $V_{CC}$ | do | 5 |

It will be observed that a first resistor 22 in the collector circuits of the turnoff drive transistors 20 in FIGS. 5—7 is 500 ohms, a resistance value which is approximately twice that of the resistor 24. Since the base-to-emitter voltage $V_{BE}$ of turnoff drive transistor 20 is approximately twice that of the collector-to-emitter voltage $V_{CE}$ the currents flowing into resistors 22 and 24 respectively will be approximately equal with the resistance imbalance described above. The above selection of resistance values for the resistors 22 and 24 provides a good turnoff drive for the output transistor 44.

I claim:

1. In a logic circuit having an input transistor for receiving one or more binary logic signals, an output transistor, and a current drive transistor connected between the input transistor and the output transistor for providing turn on drive current for the output transistor when binary logic signals concurrently applied to the input transistor reach a predetermined logical level, the improvement comprising discharge circuit means including:

a. a turnoff drive transistor having an emitter, a base and a collector;
b. a first resistor connected between said collector of said turnoff drive transistor and the base of the output transistor;
c. a second resistor connected between the base of said turnoff drive transistor and the base of the output transistor; and
d. means connecting the emitter of said turnoff drive transistor to a point of reference potential, said turnoff drive transistor and said first and second resistors providing a discharge path from the output transistor when the latter is turned off.

2. The circuit according to claim 1 wherein the resistance value of said first resistor is approximately twice that of said second resistor in order that the currents flowing through said first and second resistors to said turnoff drive transistor will be approximately equal.

3. A transistor-transistor logic circuit including in combination:

a. an input transistor having a base, a collector and a plurality of emitters connected to receive binary logic signals;
b. one output transistor having an emitter, a base and a collector;
c. one current drive transistor having an emitter, a base and a collector with the base-emitter path thereof connected between the collector of said input transistor and the base of said one output transistor, said one current drive transistor providing a turn on drive current for said one output transistor when binary logic signals concurrently applied to the emitters of the input transistor reach a predetermined logical level;

d. resistance means connected between a voltage supply terminal and respective ones of said input transistor, said one current drive transistor, and said one output transistor for biasing same and biasing said one output transistor and said one current drive transistor nonconducting in the absence of binary logic signals at a predetermined logic level concurrently applied to the emitters of said input transistor; and e. discharge circuit means including a transistor having its base and collector regions resistively connected to the base of said one output transistor and its emitter connected to a point of reference potential.

4. A circuit according to claim 3 which further includes:

a. a second output transistor connected in push-pull with said one output transistor; and b. a second current drive transistor coupled to said voltage supply terminal and connected between said one current drive transistor and said second output transistor for providing turn on drive current for said second output transistor when said one output transistor turns off.

5. The circuit according to claim 4 wherein said discharge circuit means includes:

a. a turnoff drive transistor having an emitter region, a base region and a collector region, the emitter region connected to said point of reference potential;

b. a first resistor connected between the collector region of said turnoff drive transistor and the base of said one output transistor; and c. a second resistor connected between the base region of said turnoff drive transistor and the base of said one output transistor, said first and second resistors providing a discharge path from the base of said one output transistor and through said turnoff drive transistor for rapidly removing the charge from said one output transistor when the latter is turned off.

6. The circuit according to claim 5 wherein said first resistor is substantially larger than said second resistor.

7. The circuit according to claim 6 wherein the resistance value of said first resistor is approximately twice that of said second resistor in order that the currents flowing through said first and second resistors to said turnoff drive transistor will be approximately equal.